United States Patent
Yan (10) Patent No.: US 10,529,567 B2
(45) Date of Patent: Jan. 7, 2020

(54) TRENCH GATE POWER MOSFET AND MANUFACTURING METHOD THEREOF

(71) Applicant: Shanghai Huahong Grace Semiconductor Manufacturing Corporation, Shanghai (CN)

(72) Inventor: Shufan Yan, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/043,674

(22) Filed: Jul. 24, 2018

(65) Prior Publication Data

US 2019/0035903 A1    Jan. 31, 2019

(30) Foreign Application Priority Data

Jul. 28, 2017    (CN) .......................... 2017 1 0629424

(51) Int. Cl.
*H01L 21/033*    (2006.01)
*H01L 29/423*    (2006.01)
(Continued)

(52) U.S. Cl.
CPC .......... *H01L 21/033* (2013.01); *H01L 21/027* (2013.01); *H01L 21/266* (2013.01);
(Continued)

(58) Field of Classification Search
CPC ............. H01L 29/0696; H01L 29/1095; H01L 29/66325; H01L 29/66333; H01L 29/6634;
(Continued)

(56) References Cited

U.S. PATENT DOCUMENTS

| | | | |
|---|---|---|---|
| 2007/0093019 A1* | 4/2007 | Rieger | ............... H01L 29/1095 438/243 |
| 2008/0124870 A1* | 5/2008 | Park | ..................... H01L 21/266 438/270 |

(Continued)

FOREIGN PATENT DOCUMENTS

| | | |
|---|---|---|
| CN | 101536165 A | 9/2009 |
| CN | 102097434 A | 6/2011 |

(Continued)

OTHER PUBLICATIONS

Office Action issued in corresponding CN Application No. 2017106294248, dated Aug. 20, 2019, pp. 1-2.

*Primary Examiner* — Eduardo A Rodela
(74) *Attorney, Agent, or Firm* — Murtha Cullina LLP (57) ABSTRACT

Trench gate power MOSFET with an on-region. Cells in the on-region include a first epitaxial layer and a channel region. First trenches corresponding to polysilicon gates penetrate through the channel region, and each polysilicon gate is etched to form a groove in the top, the grooves filled with an interlayer film. A source region formed on side faces of the grooves in a self-aligned mode through angled ion implantation. Through the source region of a side structure, the surface of a portion, between the first trenches, of the channel region is directly exposed and formed with a well contact region. A front metal layer is formed on the surfaces of the cells in the on-region and leads out a source. The front metal layer of the source directly makes contact with well contact region and source region to form a connection structure without contact holes.

8 Claims, 9 Drawing Sheets

(51) Int. Cl.
- *H01L 29/06* (2006.01)
- *H01L 29/10* (2006.01)
- *H01L 29/49* (2006.01)
- *H01L 29/66* (2006.01)
- *H01L 21/265* (2006.01)
- *H01L 21/266* (2006.01)
- *H01L 21/28* (2006.01)
- *H01L 29/78* (2006.01)
- *H01L 29/08* (2006.01)
- *H01L 21/027* (2006.01)

(52) U.S. Cl.
CPC ........ *H01L 21/26513* (2013.01); *H01L 21/28* (2013.01); *H01L 21/28035* (2013.01); *H01L 29/0696* (2013.01); *H01L 29/0869* (2013.01); *H01L 29/1095* (2013.01); *H01L 29/4236* (2013.01); *H01L 29/4238* (2013.01); *H01L 29/4916* (2013.01); *H01L 29/66348* (2013.01); *H01L 29/66734* (2013.01); *H01L 29/7813* (2013.01); *H01L 21/26586* (2013.01)

(58) Field of Classification Search
CPC ........... H01L 29/66348; H01L 29/7302; H01L 29/7393; H01L 29/7395; H01L 29/7397; H01L 2924/13055; H01L 21/027; H01L 21/033; H01L 21/28; H01L 21/28008; H01L 21/28035; H01L 21/44
See application file for complete search history.

(56) References Cited

U.S. PATENT DOCUMENTS

| | | | | |
|---|---|---|---|---|
| 2011/0291186 | A1* | 12/2011 | Yilmaz | H01L 29/4236 257/334 |
| 2012/0146090 | A1* | 6/2012 | Lui | H01L 29/0834 257/139 |
| 2015/0011081 | A1* | 1/2015 | Numazawa | H01L 21/28185 438/589 |
| 2018/0358449 | A1* | 12/2018 | Zeng | H01L 29/66734 |
| 2019/0122926 | A1* | 4/2019 | Darwish | H01L 21/28 |

FOREIGN PATENT DOCUMENTS

| | | |
|---|---|---|
| CN | 103545364 A | 1/2014 |
| CN | 106876453 A | 6/2017 |

* cited by examiner

FIG. 1

PRIOR ART

FIG. 2

PRIOR ART

FIG. 3A

PRIOR ART

FIG. 3B

PRIOR ART

FIG. 3C

PRIOR ART

FIG. 3D

PRIOR ART

FIG. 3E

PRIOR ART

FIG. 3F

PRIOR ART

TRENCH GATE POWER MOSFET AND MANUFACTURING METHOD THEREOF

CROSS REFERENCE TO RELATED APPLICATION

The present disclosure claims priority to Chinese patent application number 201710629424.8 filed on Jul. 28, 2017, which is incorporated by reference herein in its entirety.

TECHNICAL FIELD

The invention relates to the field of manufacturing of semiconductor integrated circuits, in particular to a trench gate power MOSFET and a manufacturing method of the trench gate power MOSFET.

DESCRIPTION OF RELATED ART

Figure 1:
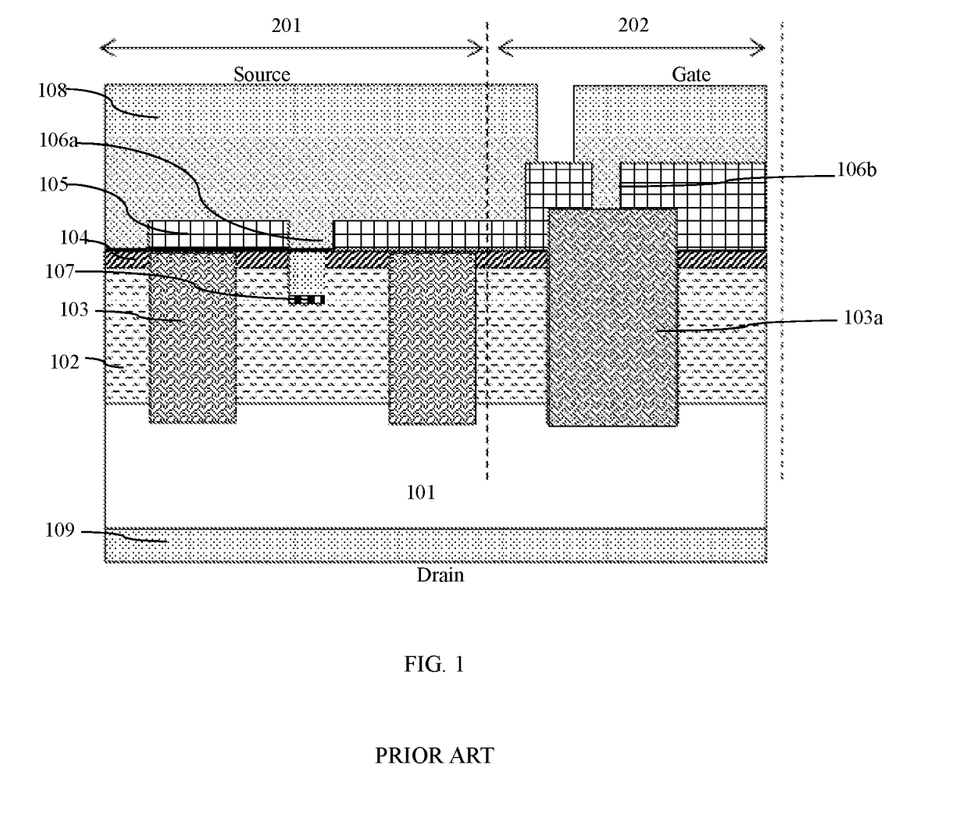
FIG. 1 is a structure view of a first existing trench gate power MOSFET.

FIG. 1 shows a structure view of a first existing trench gate power MOSFET. A first existing trench gate power MOSFET is described as follows with an N-type device as an example. Specifically, a first existing trench gate power MOSFET is provided with an on-region 201 composed of a plurality of periodically-arrayed cells, and the cells are also cell structures of the device. A channel may be formed in the on-region 201 to achieve source-drain conduction when the device operates. As shown in FIG. 1, a gate lead-out region 202 is further disposed outside the on-region 201. The cells include:

A first N-doped epitaxial layer 101 such as a silicon epitaxial layer, wherein a channel region 102 composed of P-type wells is formed on the surface of the first epitaxial layer 101.

A drift region is formed by the first epitaxial layer 101 at the bottom of the channel region 102.

A first trench is formed in the first epitaxial layer 101 and penetrate through the channel region 102. A gate dielectric layer such as gate oxide layers (not shown) is formed on the bottom surface and side faces of the first trench. The first trench is filled with polysilicon gate 103 made from polysilicon.

A heavily N-doped source region 104 is formed on the surface of the channel region 102.

The surfaces of the polysilicon gates 103 and the surface of the source region 104 are covered with an interlayer film 105.

In FIG. 1, a contact hole 106a penetrating through the interlayer film 105 is formed in the on-region 201, and the bottom of the contact hole 106a penetrates through the source region 104, so that connection to the source region 104 and the channel region 102 at the bottom of the source region 104 is achieved through the contact hole 106a. A well contact region 107 is formed at the bottom of the contact hole 106a.

A front metal layer 108 is patterned to form a source. As shown in FIG. 1, the front metal layer 108 of the source in the on-region 201 is connected to the source region 104 at the bottom and the channel region 102 through the contact hole 106a.

A drain region (not shown) is composed of a heavily N-doped region formed on the back side of the drift region, and a drain composed of a back metal layer 109 is formed on the back side of the drain region.

A second trench is formed in the gate lead-out region 202 outside the on-region 201 and is wider than the first trench. The second trench and the first trench are connected and

2 formed at the same time. A contact hole 106b is formed in the top of the wide second trench.

A gate dielectric layer is formed on the bottom surface and side face of the second trench, and the second trench is filled with a polysilicon gate 103a made from polysilicon. The gate dielectric layer in the second trench and the gate dielectric layer in the first trench are formed at the same time. The polysilicon gate 103a in the second trench and the polysilicon gate 103 in the first trench are formed at the same time and are connected mutually.

In the gate lead-out region 202, except the portion where the polysilicon gate 103a in the second trench is located, the surface of the channel region 102 is also doped with the source region 104.

The contact hole 106b is formed in the top of the polysilicon gate 103a in the second trench, and the polysilicon gates 103 are connected to a gate formed by the front metal layer 108 through the contact hole 106b.

A contact region is formed at the bottom of the contact hole 106b while the well contact region 107 is formed.

As shown in FIG. 1, the on-region 201 includes a plurality of cells. Each cell has a pitch consisting of the width of a first trench and the interval between two adjacent first trenches, namely one first trench and the interval between the two adjacent first trenches form one cell structure. i.e. a cell. Multiple cells are formed in the on-region 201 and connected in parallel. Only two first trenches are shown in FIG. 1, but in fact, one or more first trenches can be arrayed in the on-region 201 at intervals, and the number of the first trench is set according to the number of the cells in the on-region 201. As shown in FIG. 1, due to the fact that the contact hole 106a for leading out the source region 104 and the channel region 102 is formed in the on-region 201 and located in an area between the two first trenches in the on-region 201, reduction of the distance between the first trenches is limited by the contact hole 106a. As for the trench gate power MOSFET, the smaller the interval between the cells, the smaller the pitch, the greater the channel density, and the smaller the on-resistance is. Under the restriction of the contact hole 106a, the interval between the cells cannot be further reduced, consequentially, a greater channel density and a smaller on-resistance cannot be obtained, and the integrity of the device cannot be improved.

Figure 2:
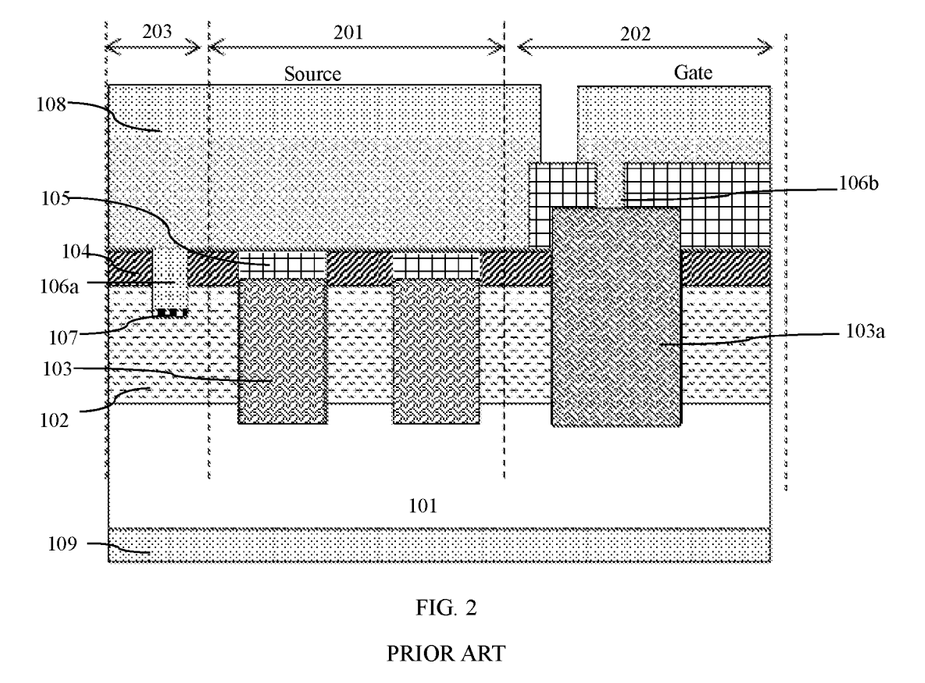
FIG. 2 is a structure view of a second existing trench gate power MOSFET.

In order to obtain a greater channel density and a smaller on-resistance, a second trench gate power MOSFET shown in FIG. 2 is adopted in the prior art. By comparing FIG. 2 with FIG. 1, the second existing trench gate power MOSFET differs from the first existing trench gate power MOSFET in the following aspects:

In the on-region 201, the top of the polysilicon gate 103 is etched back to be lower than the top of the first trench, so that a groove is formed in the top of the first trench. Only the groove in the top of the first trench is filled with the interlayer film 105, and the portion, outside the first trench, of the source region 104 is not covered with the interlayer film 105 anymore and is directly exposed, so that the source region 104 directly makes contact with the front metal layer 108 of the source without a contact hole. On this basis, the source region 104 is led out without forming a contact hole in the on-region 201 in the structure shown in FIG. 2, so that the interval between the adjacent two first trenches in the on-region 201 is not limited by a contact hole anymore, the interval between the first trench of the cells can be further reduced, the pitch is also reduced, and thus, a greater channel density and a smaller on-resistance are obtained.

However, due to the fact that the surface of the on-region 201 is completely covered with the source region 104, the front metal layer 108 of the source in the on-region 201 cannot be directly connected to the channel region 102. In order to achieve connection between the front metal layer 108 of the source and the channel region 102, a well lead-out region 203 needs to be additionally arranged in the second structure shown in FIG. 2, a contact hole 106a is formed in the well lead-out region 202, and the bottom of the contact hole 106a penetrates through the source region 104 to be connected to the channel region 102. Notably, the structure in FIG. 1 includes a plurality of contact holes 106a, namely one contact hole 106a needs to be formed between every two adjacent first trenches; however, in FIG. 2, only one contact hole 106a needs to be formed in the well lead-out region 203. Thus, although the interval between the first trench is reduced in the second structure, the well lead-out region 203 for forming the contact hole 106a used to lead out the channel region 102 needs to be additionally arranged, and the area of the device is increased by the well lead-out region 203.

Figure 3A:
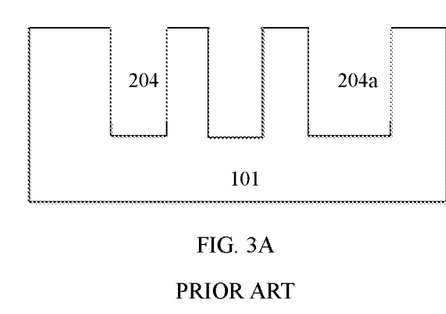
FIGS. 3A-3F are device structure views in all steps of a manufacturing method of the second existing trench gate power MOSFET shown in FIG. 2.
Figure 3B:
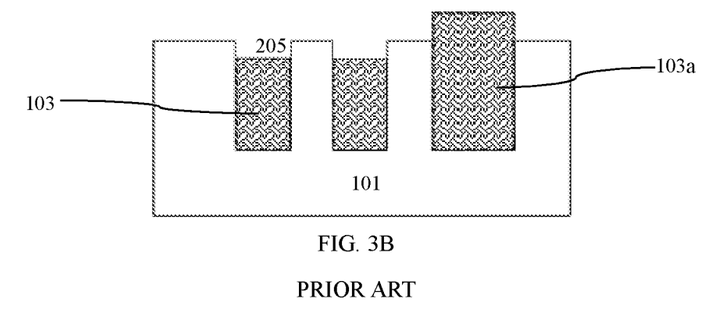
Figure 3C:
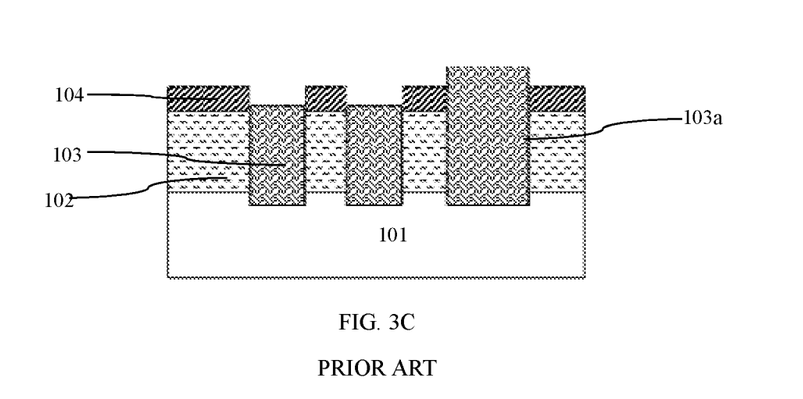
Figure 3D:
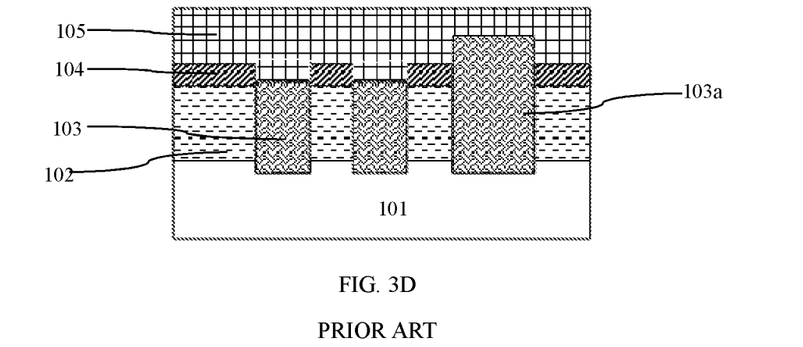
Figure 3E:
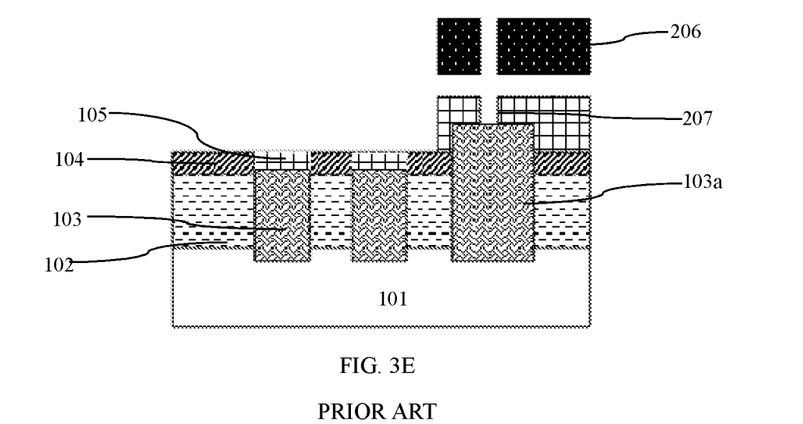
Figure 3F:
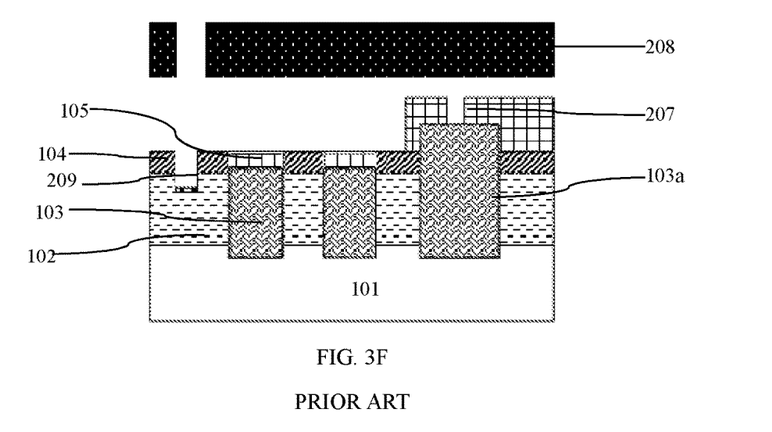

FIGS. 3A-3F are device structure views in all steps of a manufacturing method of the second existing trench gate power MOSFET shown in FIG. 2. The manufacturing method of the second existing trench gate power MOSFET includes the following cell formation steps:

Step 1, as shown in FIG. 3A, a first N-doped epitaxial layer 101 is provided, and a plurality of trenches including first trenches 204 in an on-region 201 and a second trench 204a in a gate lead-out region 202 are formed in the first epitaxial layer 101 through photolithograph process, wherein the first epitaxial layer 101 is generally a silicon epitaxial layer and is formed on the surface of a silicon substrate;

Step 2, as shown in FIG. 3B, gate dielectric layers are formed on the bottom surface and side face of the first trench 204, polysilicon deposition and polysilicon etching back are conducted to form polysilicon gates 103 in the first trench 204, and a gate dielectric layer and a polysilicon gate 103a are formed in the second trench 204a at the same time, wherein the gate dielectric layers can be gate oxide layers formed through a thermal oxidation process;

As shown in FIG. 3B, the top surface of the polysilicon gate 103 are lower than the top surface of the first trench 204, and a groove 205 is formed in the top of each polysilicon gate 103, wherein the groove 205 is used for subsequently forming a source region 104, in contact with a front metal layer 108, between the first trench 204 in a self-aligned mode;

Step 3, as shown in FIG. 3C, comprehensive heavily N-doped ion implantation is conducted to form the source region 104;

Step 4, as shown in FIG. 3D, an interlayer film 105 is formed;

Step 5, as shown in FIG. 3E, the interlayer film 105 is etched back after a formation area of a contact hole 106b in the gate lead-out region 202 is defined by a photoresist pattern 206, after back-etching, the portion, on the surface of the on-region 201 and on the surface of the well lead-out region 203, of the interlayer film 105 is removed, the portion, in the on-region 201, of the interlayer film 105 is formed in the grooves 205 in a self-aligned mode, and an opening 207, penetrating through the interlayer film 105, of the contact hole 106b is formed in the gate lead-out region 202;

Step 6, as shown in FIG. 3F, a photoresist pattern 208 is formed through the photolithograph process and used to define a formation area of a contact hole 106a in the well lead-out region 203, and then the first epitaxial layer 101 is etched to form an opening 209, penetrating through the source region 104, of the contact hole 106a penetrating through the source region 104;

Afterwards, a well contact region 107 is formed on the bottom surface of the opening 209;

Step 7, as shown in FIG. 2, the opening 209 and the opening 207 are filled with metal to form the contact hole 106a and the contact hole 106b, and the front metal layer 108 is formed and patterned to form a source and a gate; and Step 8, as shown in FIG. 2, the back side of the silicon substrate is grinded for thickness reduction before an N-doped drain region on the back side is formed, and finally, a back metal layer 109 is formed to lead out a drain.

BRIEF SUMMARY OF THE INVENTION

The technical issue to be settled by the invention is to provide a trench gate power MOSFET, which further decreases the area of a chip and improves the integrity of the chip while the channel density of the device is improved and the on-resistance of the device is reduced. The invention further provides a manufacturing method of a trench gate power MOSFET.

To settle the above-mentioned technical issue, the invention provides a trench gate power MOSFET provided with an on-region composed of a plurality of periodically-arrayed cells. The cells include:

A first doped epitaxial layer of a first conduction type, wherein a channel region composed of wells of a second conduction type is formed on the surface of the first epitaxial layer.

A drift layer is formed by the first epitaxial layer at the bottom of the channel region.

A first trench is formed in the first epitaxial layer and penetrate through the channel region. A gate dielectric layer is formed on the bottom surface and side faces of the first trench. The first trench is filled with polysilicon gates made from polysilicon. The polysilicon gate is etched back until the top surface of the polysilicon gate are lower than the top surface of the first trench, and a groove is formed in the top of each polysilicon gate. The groove is filled with an interlayer film.

A heavily-doped source region of the first conduction type is composed of angled ion implantation regions formed on the side faces of the grooves and located in the first epitaxial layer, and implantation of the angled ion implantation regions is conducted through a hard mask layer for defining the first trench after the grooves are formed while not filled with the interlayer film.

Through the source region of a side structure, the surface of the portion, between the adjacent two first trenches, of the channel region is directly exposed and directly formed with a well contact region composed of heavily-doped regions of the second conduction type. The junction depth of the well contact region is smaller than the depth of the source region. The well contact region makes contact with the channel region and the source region at the same time.

A front metal layer is formed on the surfaces of all the cells in the on-region at the same time, and a source is led out through the front metal layer. The front metal layer of the source directly makes contact with the well contact region and the source region to form a connection structure without contact holes, so that the pitch of the cells is decreased, and the integrity of the device is improved.

Furthermore, a drain region is composed of a heavily-doped region which is of the first conduction type and formed on the back side of the drift region. A drain composed of a back metal layer is formed on the back side of the drain region.

Furthermore, a gate lead-out region is located outside the on-region. A second trench is formed in the gate lead-out region and is wider than the first trench. The second trench and the first trench are communicated and formed at the same time A gate dielectric layer is formed on the bottom surface and side face of the second trench, and the second trench is filled with a polysilicon gate made from polysilicon. The gate dielectric layer in the second trench and the gate dielectric layer in the first trench are formed at the same time. The polysilicon gate in the second trench and the polysilicon gate in the first trench are formed at the same time and are connected.

The top surface of the polysilicon gate in the second trench is higher than or as high as the top surface of the second trench. The side face of the polysilicon gate in the second trench is directly covered with the channel region not doped with the source region.

A contact hole is formed in the top of the polysilicon gate in the second trench, and the polysilicon gates are connected to a gate formed by the front metal layer through the contact hole.

Furthermore, a contact region is formed at the bottom of the contact hole while the well contact region is formed.

Furthermore, the first epitaxial layer is a silicon epitaxial layer.

Furthermore, the gate dielectric layers are gate oxide layers.

Furthermore, the trench gate power MOSFET is an N-type device and has a first conduction type of N and a second conduction type of P; or, the trench gate power MOSFET is a P-type device and has a first conduction type of P and a second conduction type of N.

To settle the above-mentioned technical issue, the invention further provides a manufacturing method of a trench gate power MOSFET provided with an on-region composed of a plurality of periodically-arrayed cells. The manufacturing method comprises the following cell formation steps:

Step 1, a first doped epitaxial layer of a first conduction type is provided, a channel region composed of wells of a second conduction type is formed in the surface area of the first epitaxial layer, and a drift region is formed by the first epitaxial layer at the bottom of the channel region;

Step 2, a hard mask layer is formed on the surface of the first epitaxial layer, formation areas of trenches are defined through a photolithograph process, and the hard mask layer and the first epitaxial layer are sequentially etched to form first trenches penetrating through the channel region;

Step 3, under the condition that the hard mask layer is reserved, gate dielectric layers are formed on the bottom surfaces and side faces of the first trench, and then polysilicon is formed to completely fill the first trench and extends to the surface of the hard mask layer outside the first trench;

Step 4, under the condition that the hard mask layer is reserved, the polysilicon is etched back until all polysilicon outside the first trench in the on-region is etched away, the polysilicon left in the first trench forms polysilicon gates with the top surfaces lower than the top surfaces of the first trench, and a groove is formed in the top of each polysilicon gate;

Step 5, under the condition that the hard mask layer is reserved, heavily-doped ions of the first conduction type are implanted with angle into the portions, located on the side faces of the grooves, of the first epitaxial layer to form a source region of a side structure;

Step 6, the hard mask layer is removed to directly expose the surface of the portion, between the first trench, the channel region;

Step 7, an interlayer film is formed and etched back until the interlayer film in the on-region only fills the grooves, and the surface of an area between the first trenches is opened;

Step 8, heavily-doped implantation of the second conduction type is conducted to directly form a well contact region on the surface of the portion, between the first trenches, of the channel region, wherein the junction depth of the well contact region is smaller than the depth of the source region, and the well contact region makes contact with the channel region and the source region at the same time;

Step 9, a front metal layer is formed on the surfaces of all the cells in the on-region at the same time and patterned to from a source, the source is led out through the front metal layer, the front metal layer of the source directly makes contact with the well contact region and the source region of all the cells in the on-region to form a connection structure without contact holes, and thus the pitch of the cells is decreased, and the integrity of the device is improved;

Furthermore, the manufacturing method further includes the following steps:

Heavily-doped implantation of the first conduction type is conducted on the back side of the drift region to form a drain region;

A back metal layer is formed on the back side of the drain region, and a drain is formed by the back metal layer.

Furthermore, the gate lead-out region is located outside the on-region, a second trench which is wider than the first trench is formed in the gate lead-out region, and the second trench and the first trench are communicated and formed at the same time in Step 2.

A gate dielectric layer is formed on the bottom surface and side face of the second trench. The second trench is filled with a polysilicon gate made from polysilicon. The gate dielectric layer in the second trench and the gate dielectric layer in the first trench are formed at the same time in Step 3. The polysilicon gate in the second trench and the polysilicon gate in the first trench are formed at the same time in Step 3 and are connected.

In Step 4, the polysilicon gate in the second trench is etched back until the top surface of the polysilicon gate is higher than or as high as the top surface of the second trench.

In Step 5, the source region obtained through angled ions implantation will not be formed in the portion, located on the side face of the second trench, of the channel region.

In Step 7, before the interlayer film is etched back, a formation area of a contact hole is opened at the top of the second trench through a photolithograph process, and after the interlayer film is etched back, an opening of the contact hole is formed in the top of the polysilicon gate in the second trench.

In Step 9, after the front metal layer is patterned, a gate is also formed, and the gate is connected to the polysilicon gate in the second trench through the corresponding contact hole and also connected to the polysilicon gate in the first trench through the polysilicon gate.

Furthermore, in Step 8, a contact region is formed at the bottom of the contact hole while the well contact region is formed.

Furthermore, the first epitaxial layer is a silicon epitaxial layer.

Furthermore, the first epitaxial layer is formed on the surface of a silicon substrate.

Furthermore, the gate dielectric layers are gate oxide layers.

Furthermore, the trench gate power MOSFET is an N-type device and has a first conduction type of N and a second conduction type of P; or, the trench gate power MOSFET is a P-type device and has a first conduction type of P and a second conduction type of N.

According to the invention, the pitch of each of the cells in the on-region of the invention consists of the width of one first trench and the interval between the first trenches. The groove structure are formed in the top of the first trench by etching the polysilicon gates back, the source region of the side structure is formed on the side faces of the grooves in a self-aligned mode through angled ion implantation, and after the grooves are filled with the interlayer film, the area between the first trenches can be opened automatically to directly make contact with the front metal layer corresponding to the source without a contact hole, so that a contact hole does not need to be formed between the first trenches anymore, the interval between the first trenches can be reduced without being limited by a contact hole, and thus, the channel density of the device is improved, and the on-resistance of the device is reduced.

In addition, the surface of the channel region between the first trenches, is not completely covered with the source region of the side structure and can be exposed, and the channel region can be directly connected to the front metal layer without a contact hole penetrating through the source region, so that a well lead-out region for forming a contact hole used to lead out the channel region does not need to be additionally formed, and thus, the area of a chip is further decreased, and the integration of the chip is further improved.

BRIEF DESCRIPTION OF THE SEVERAL VIEWS OF THE DRAWINGS

The invention is further described in detail as follows in combination with the drawings and specific embodiments.

DETAILED DESCRIPTION OF THE INVENTION

Figure 4:
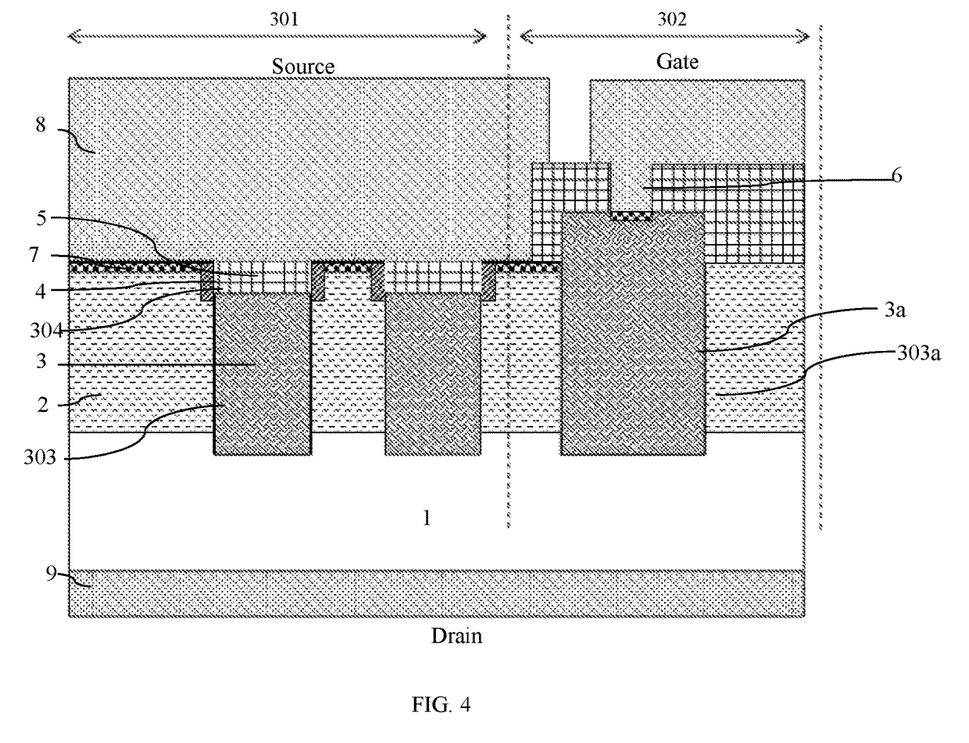
FIG. 4 is a device structure view of one embodiment of the invention.

As shown in FIG. 4 which is a device structure view of one embodiment of the invention, a trench gate power MOSFET in this embodiment of the invention is provided with an on-region 301 composed of a plurality of periodically-arrayed cells, and the cells are also cell structures of the device. The cells include:

A first doped epitaxial layer 1 of a first conduction type, wherein and a channel region 2 formed on the surface of the first epitaxial layer 1 by wells of a second conduction type.

A drift layer is formed by the first epitaxial layer 1 at the bottom of the channel region 2.

First trenches 303 are formed in the first epitaxial layer 1 and penetrate through the channel region 2. Gate dielectric layers (not shown) are formed on the bottom surface and side face of the first trench 303. The first trench 303 is filled with polysilicon gate 3 made from polysilicon. The polysilicon gate 3 are etched back until the top surface of the polysilicon gate 3 is lower than the top surface of the first trench 303, and a groove 304 is formed in the top of each polysilicon gate 3. The grooves 304 are filled with an interlayer film 5.

A heavily-doped source region 4 of the first conduction type is composed of angled ion implantation regions formed on the side faces of the grooves 304 and located in the first epitaxial layer 1, and implantation of the angled ion implantation regions is conducted through a hard mask layer 305 (please refer to FIG. 5B) for defining the first trench 303 after the grooves 304 are formed while not filled with the interlayer film 5.

Through the source region 4 of a side structure, the surface of the portion, between the first trenches 303, of the channel region 2 is directly exposed and directly formed with a well contact region 7 composed of heavily-doped regions of the second conduction type. The junction depth of the well contact region 7 is smaller than the depth of the source region 4. The well contact region 7 makes contact with the channel region 2 and the source region 4 at the same time.

A front metal layer 8 is formed on the surfaces of all the cells in the on-region 301 at the same time, and a source is led out through the front metal layer 8. The front metal layer 8 of the source directly makes contact with the well contact region 7 and the source region 4 to form a connection structure without contact holes, so that the pitch of the cells is decreased, and the integrity of the device is improved.

A drain region (not shown) is composed of a heavily-doped region which is of the first conduction type and formed on the back side of the drift region. A drain composed of a back metal layer 9 is formed on the back side of the drain region.

A gate lead-out region 302 is located outside the on-region 301. A second trench 303a is formed in the gate lead-out region 302 and is wider than the first trench 303. The second trench 303a and the first trench 303 are communicated and formed at the same time.

A gate dielectric layer is formed on the bottom surface and side face of the second trench 303a, and the second trench 303a is filled with a polysilicon gate 3a made from polysilicon. The gate dielectric layer in the second trench 303a and the gate dielectric layers in the first trench 303 are formed at the same time. The polysilicon gate 3a in the second trench 303a and the polysilicon gate 3 in the first trench 303 are formed at the same time and connected mutually.

The top surface of the polysilicon gate 3a in the second trench 303a is higher than or as high as the top surface of the second trench 303a. The side face of the polysilicon gate 3a in the second trench 303a is directly covered with the channel region 2 not doped with the source region 4.

A contact hole 6 is formed in the top of the polysilicon gate 3a in the second trench 303a, and the polysilicon gates 3 are connected to the front metal layer 8 through the contact hole 6 to form a gate.

A contact region is formed at the bottom of the contact hole 6 while the well contact region 7 is formed.

In this embodiment of the invention, the first epitaxial layer 1 is a silicon epitaxial layer, and the gate dielectric layers are gate oxide layers. The trench gate power MOSFET is an N-type device and has a first conduction type of N and a second conduction type of P. In other embodiments, the trench gate power MOSFET may be a P-type device and have a first conduction type of P and a second conduction type of N.

As shown in FIG. 4, the on-region 301 includes multiple cells, and the pitch of each cell consists of the width of one first trench 303 and the interval between the first trenches 303. Only two first trenches 303 are shown in FIG. 4, but in fact, multiple sets of two first trenches 303 are arrayed in the on-region 301 at intervals, and the number of the first trench 303 is set according to the number of the cells in the on-region 301. As shown in FIG. 4, the front metal layer 8 in the whole on-region 301 directly makes contact with the source region 4 and the well contact region 7 and is connected to the channel region 2 through the well contact region 7, so that no contact hole needs to be formed in the whole on-region 301, making the interval between the first trenches 303 not limited by the width of a contact hole anymore and reduced, thus, improving the channel density of the device and reducing the on-resistance of the device. Meanwhile, as the source region 4, the well contact region 7 and the channel region 2 are directly connected to the front metal layer 8, a lead-out region for the channel region 2 does not need to be additionally arranged outside the on-region 301 anymore. Thus, in this embodiment of the invention, neither a contact hole in the on-region 301 nor a lead-out region for the channel region 2 needs to be additionally arranged, so that an area for manufacturing a lead-out region for the channel region 2 is not needed, the area of a chip is further decreased, and thus, the integrity of the chip is further improved.

FIGS. 5A-5I are device structure views in all steps of a method in one embodiment of the invention. According to the manufacturing method of the trench gate power MOSFET in one embodiment of the invention, an on-region 301 of the device is composed of a plurality of periodically-arrayed cells. Besides the on-region 301, the device further includes a gate lead-out region 302 outside the on-region 301. Formation steps of the structure in the gate lead-out region 302 are subsequently explained in combination with formation steps of the cells.

Figure 5A:
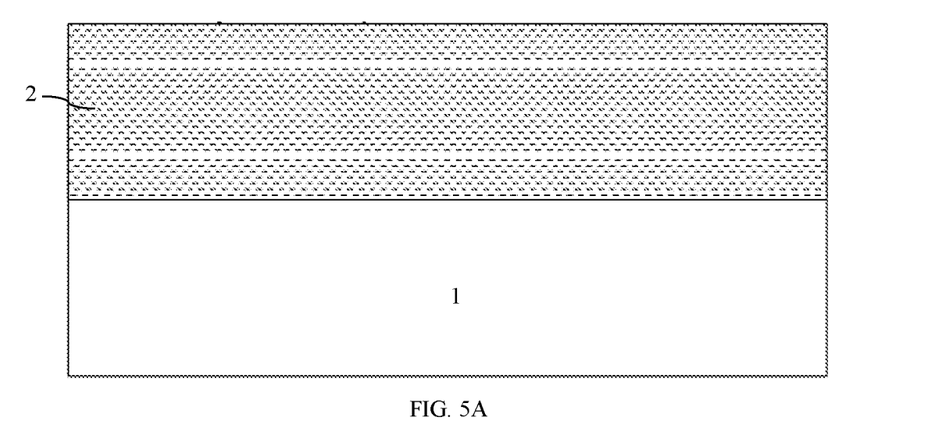
FIGS. 5A-5I are device structure views in all steps of a method in one embodiment of the invention.
Figure 5B:
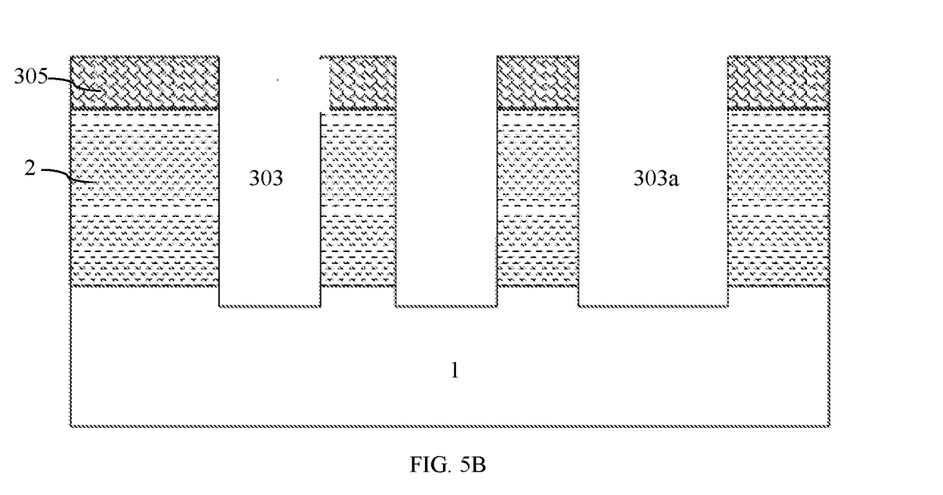
Figure 5C:
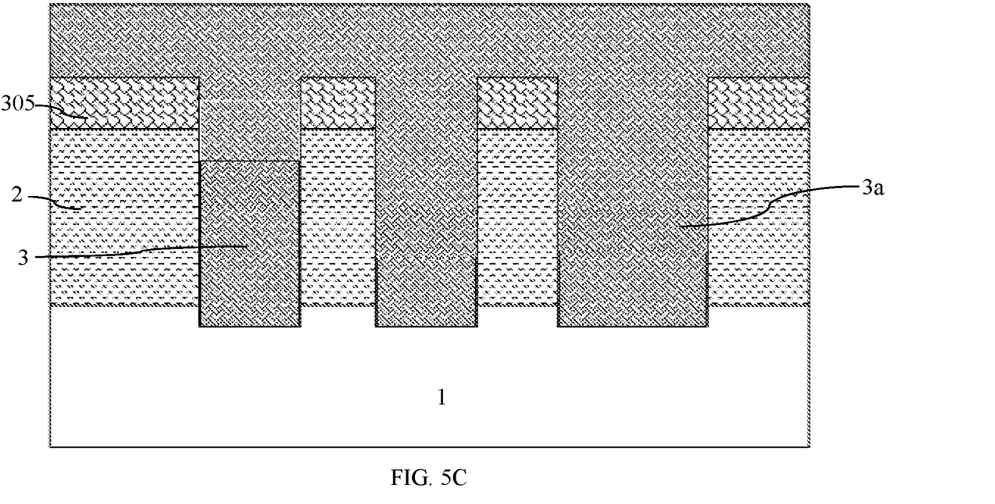
Figure 5D:
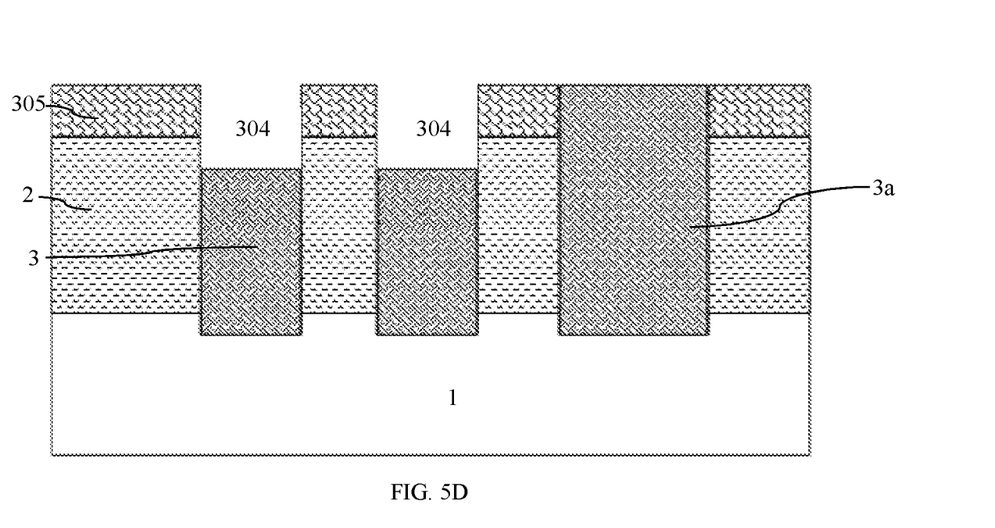
Figure 5E:
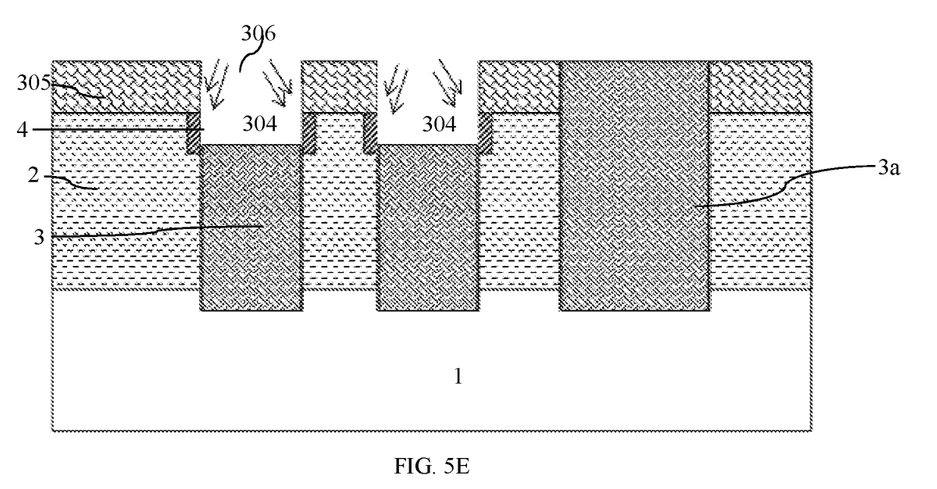
Figure 5F:
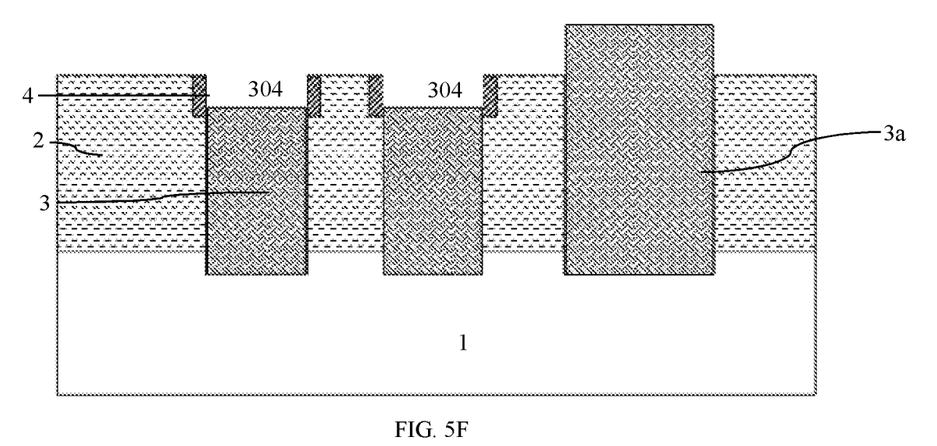
Figure 5G:
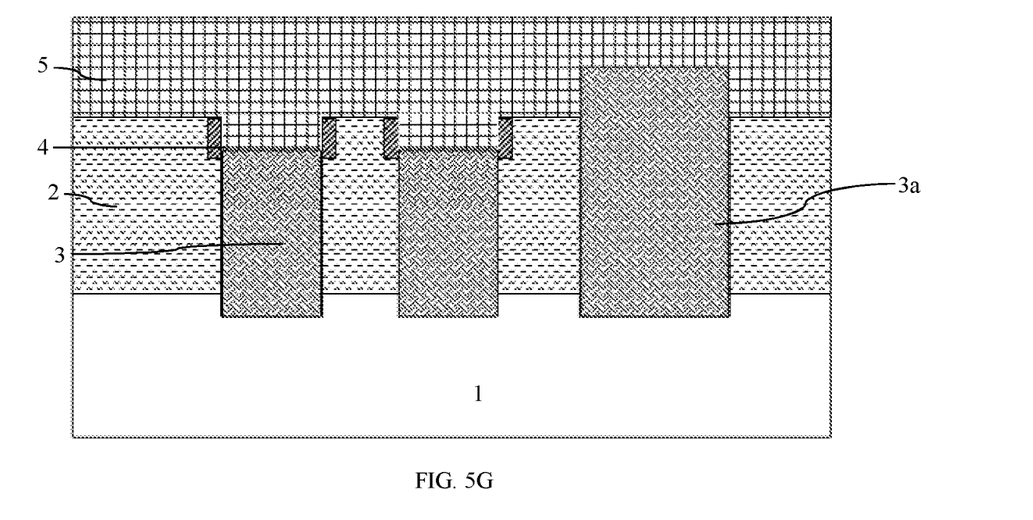
Figure 5H:
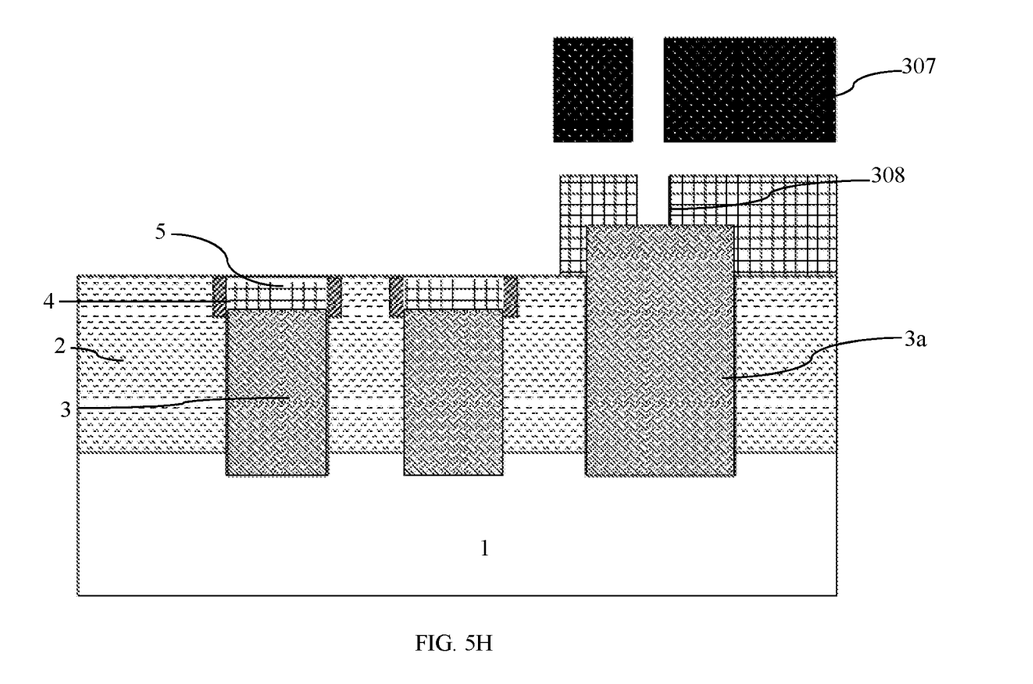
Figure 5I:
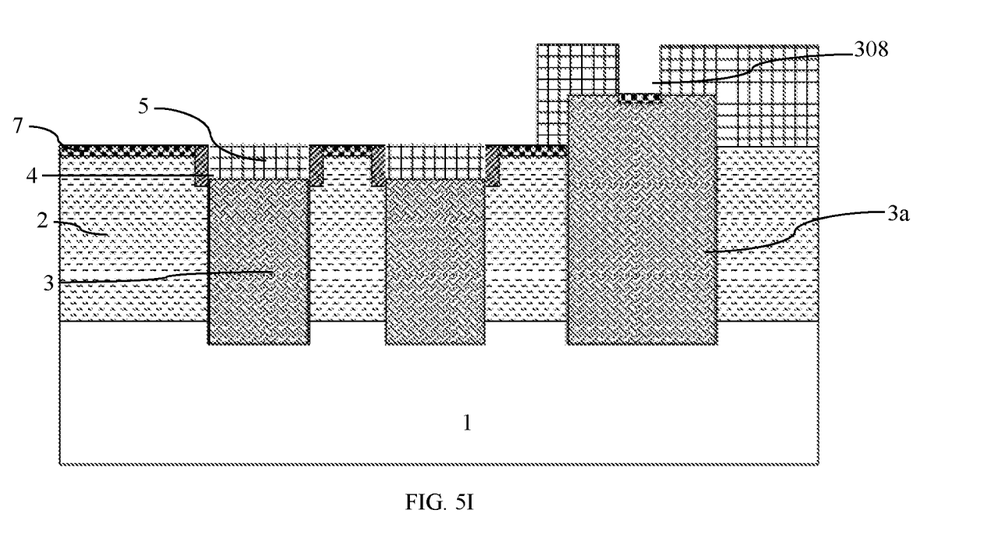

The formation steps of the cells include:

Step 1, as shown in FIG. 5A, a first doped epitaxial layer 1 of a first conduction type is provided, a channel region 2 composed of wells of a second conduction type is formed in the surface area of the first epitaxial layer 1, and a drift region is formed by the first epitaxial layer 1 at the bottom of the channel region 2;

Preferably, the first epitaxial layer 1 is a silicon epitaxial layer and is formed on the surface of a silicon substrate;

Step 2, as shown in FIG. 5B, a hard mask layer 305 is formed on the surface of the first epitaxial layer 1, formation areas of trenches are defined through a photolithograph process, and the hard mask layer 305 and the first epitaxial layer 1 are sequentially etched to form first trenches 303 penetrating through the channel region 2;

A second trench 303a which is wider than the first trench 303 is formed in the gate lead-out region 302 at the same time;

Step 3, as shown in FIG. 5C, under the condition that the hard mask layer 305 is reserved, gate dielectric layers are formed on the bottom surface and side face of the first trench 303, and then polysilicon 3 is formed to completely fill the first trench 303 and extends to the surface of the hard mask layer 305 outside the first trench 303, wherein the gate dielectric layers are preferably gate oxide layers and are formed through a thermal oxidation process;

In the gate lead-out region 302, a gate dielectric layer is formed on the bottom surface and side face of the second trench 303a, and the second trench 303a is filled with polysilicon 3a, wherein the polysilicon 3 and the polysilicon 3a are actually identical, which means that the polysilicon 3 and the polysilicon 3a are formed at the same time through the same formation process, and for a clear description, the polysilicon obtained in the gate lead-out region 302 is marked as 3a;

Step 4, as shown in FIG. 5D, under the condition that the hard mask layer 305 is reserved, the polysilicon 3 is etched back until all polysilicon 3 outside the first trench 303 in the on-region 301 is etched away, the polysilicon 3 left in the first trench 303 forms polysilicon gate 3 with the top surface lower than the top surface of the first trench 303, and a groove 304 is formed in the top of each polysilicon gate 3;

In the gate lead-out region 302, the polysilicon 3a is etched back to be flush with the surface of the hard mask layer 305; in other embodiments, the top surface of the polysilicon gate 3a in the second trench 303a is higher than or as high as the top surface of the second trench 303a, and the polysilicon 3a left in the second trench 303a after back-etching forms a polysilicon gate 3a;

By the fact that the first trench 303 and the second trench 303a are actually communicated (communicated areas are not shown), both ends of each first trench 303 can be communicated with the second trench 303a in the top view, and thus, the polysilicon gate 3a in the second trench 303a and the polysilicon gate 3 in the first trench 303 are formed and connected, namely after being applied to the polysilicon gate 3a, a voltage is actually applied to the polysilicon gates 3 through the polysilicon gate 3a;

Step 5, as shown in FIG. 5E, under the condition that the hard mask layer 305 is reserved, heavily-doped angled ions of the first conduction type are implanted into the portions, located on the side faces of the grooves 304, of the first epitaxial layer 1 to form a source region 4 of a side structure, wherein angled ion implantation is marked as 306;

In the gate lead-out region 302, due to the absence of a groove lower than the surface of the first epitaxial layer 1 (namely the top surface of the second trench 303a), the source region 4 obtained through angled ions implantation will not be formed in the portion, located on the side face of the second trench 303a, of the channel region 2, and thus, no source region is formed in the gate lead-out region 302;

Step 6, as shown in FIG. 5F, the hard mask layer 305 is removed to directly expose the surface of the portion, between the first trenches 303, the channel region 2;

Step 7, as shown in FIG. 5G, an interlayer film 5 is formed;

As shown in FIG. 5H, the interlayer film 5 is etched back until the interlayer film 5 in the on-region 301 fills the grooves 304 only, and the surface of an area between the first trenches 303 is opened;

In the gate lead-out region 302, before the interlayer film 5 is etched back in Step 7, a photoresist pattern 307 is formed through a photolithograph process, a formation area of a contact hole 6 is opened at the top of the second trench 303a, and after the interlayer film 5 is etched back, an opening 308 of the contact hole 6 is formed in the top of the polysilicon gate 3a in the second trench 303a;

Step 8, as shown in FIG. 5I, heavily-doped implantation of the second conduction type is conducted to directly form a well contact region 7 on the surface of the channel region 2 between the first trenches 303, wherein the junction depth of the well contact region 7 is smaller than the depth of the source region 4, and the well contact region 7 makes contact with the channel region 2 and the source region 4 at the same time; as shown in FIG. 5I, by the fact that the source region 4 obtained by the method in this embodiment of the invention is of the side wall structure, the well contact region 7 directly makes contact with the surface of the channel region 2, which is completely different from an existing structure so designed that a source region covers the surface of a whole channel region and a contact hole penetrating through the source region is needed to lead out the channel region, namely through the method in this embodiment of the invention, a contact hole for leading out of the channel region is not needed anymore, which also means that a contact hole does not need to be formed in the on-region 301 and a lead-out region for forming a contact hole to lead out the channel region does not need to be additionally arranged outside the on-region 301 either;

In the gate lead-out region 302, a contact region is formed at the bottom of the contact hole 6 during implantation of the well contact region 7;

Step 9, as shown in FIG. 4, a front metal layer 8 is formed on the surfaces of all the cells in the on-region 301 at the same time and patterned to from a source, the source is led out through the front metal layer 8, the front metal layer 8 of the source directly makes contact with the well contact region 7 and the source region 4 of all the cells in the on-region 301 to form a connection structure without contact holes, and thus the pitch of the cells is decreased, and the integrity of the device is improved;

In the gate lead-out region 302, after the front metal layer 8 is patterned, a gate is formed, and the gate is connected to the polysilicon gate 3a in the second trench 303a through the corresponding contact hole 6 and also connected to the polysilicon gate 3 in the first trench 303 through the polysilicon gate 3a, wherein the contact hole 6 is formed by filling the opening 308 with metal.

The manufacturing method further includes the following steps:

Heavily-doped implantation of the first conduction type is conducted on the back side of the drift region to form a drain region, specifically in the method in this embodiment of the invention, the silicon substrate is a heavily-doped structure of the first conduction type, and the drain region is directly formed by the silicon substrate with the back side thinned; or, the drain region is doped with the silicon substrate with the back side thinned as well as implanted with heavily-doped impurities of the first conduction type;

A back metal layer 9 is formed on the back side of the drain region, and a drain is formed by the back metal layer 9.

According to the method in this embodiment of the invention, the trench gate power MOSFET is an N-type device and has a first conduction type of N and a second conduction type of P. In other embodiments of the method, the trench gate power MOSFET may be a P-type device and have a first conduction type of P and a second conduction type of N.

The invention is described in details above in combination with the specific embodiments; however, these specific embodiments are not restrictive to the invention. Various transformations and improvements can be made by those skilled in this field without deviating from the principle of the invention, and all these transformations and improvements should fall within the protection scope of the invention.

What is claimed is:

1. A manufacturing method of a trench gate power MOSFET, comprising the following steps for forming a cell, wherein an on-region of MOSFET is composed of a plurality of periodically-arrayed cells:

Step 1, providing a first doped epitaxial layer of a first conduction type, forming a channel region in a surface area of the first epitaxial layer by a well of a second conduction type, and forming a drift region by the first epitaxial layer at a bottom of the channel region;

Step 2, forming a hard mask layer on a surface of the first epitaxial layer, defining formation areas of a trench through a photolithograph process, and sequentially etching the hard mask layer and the first epitaxial layer to form the first trench penetrating through the channel region;

Step 3, under a condition that the hard mask layer is reserved, forming gate dielectric layers on a bottom surface and side faces of the first trench, and then forming a polysilicon which completely fills the first trench and extends to a surface of the hard mask layer outside the first trench;

Step 4, under the condition that the hard mask layer is reserved, etching the polysilicon back until all polysilicon outside the first trench in the on-region is removed, forming a polysilicon gate with a top surface lower than the top surface of the first trench by the polysilicon left in the first trench, and forming a groove in a top of each said polysilicon gate;

Step 5, under the condition that the hard mask layer is reserved, conducting heavily-doped angled ion implantation of the first conduction type to form a source region of side structure in the first epitaxial layer of a side face of the groove;

Step 6, removing the hard mask layer to directly expose a surface of the channel region located between adjacent first trenches;

Step 7, forming an interlayer film, then etching the interlayer film back until the interlayer film in the on-region only fills the groove, and opening a surface of an area between the adjacent first trenches;

Step 8, conducting heavily-doped implantation of the second conduction type to directly form a well contact region on the surface of the channel region between the adjacent first trenches, wherein the well contact region has a junction depth smaller than a depth of the source region, and the well contact region makes contact with the channel region and the source region at the same time; and Step 9, forming a front metal layer and patterning the front metal layer to from a source, wherein the front metal layer is formed on the surface of each cell in the on-region at the same time and the source is led out from the front metal layer, the front metal layer of the source directly makes contact with the well contact region and the source region of each cell in the on-region to form a connection structure without contact holes, and thus a pitch of the cells is decreased, and integrity of the device is improved.

2. The manufacturing method of the trench gate power MOSFET according to claim 1, further including the following steps:

conducting heavily-doped implantation of the first conduction type on a back side of the drift region to form a drain region; and forming a back metal layer on a back side of the drain region, and leading out a drain from the back metal layer.

3. The manufacturing method of the trench gate power MOSFET according to claim 1, wherein a gate lead-out region is located outside the on-region and comprise a second trench wider than the first trench, and the second trench and the first trench are connected and formed at the same time in Step 2;

a gate dielectric layer is formed on a bottom surface and side faces of the second trench, the second trench is filled with a polysilicon gate made of polysilicon, the gate dielectric layer in the second trench and the gate dielectric layers in the first trench are formed at the same time in Step 3, and the polysilicon gate in the second trench and the polysilicon gate in the first trench are formed at the same time in Step 3 and are connected with each other;

in Step 4, the polysilicon gate in the second trench is etched back until a top surface of the polysilicon gate is higher than or as high as a top surface of the second trench;

in Step 5, the source region obtained through angled ions implantation is not formed in the channel region located on the side face of the second trench;

in Step 7, before the interlayer film is etched back, a formation area of a contact hole is opened at a top of the second trench by a photolithograph process, and after the interlayer film is etched back, an opening of the contact hole is formed in a top of the polysilicon gate in the second trench; and     in Step 9, after the front metal layer is patterned, a gate is also formed, and the gate is connected to the polysilicon gate in the second trench through the corresponding contact hole and also connected to the polysilicon gate in the first trench through the polysilicon gate.

4. The manufacturing method of the trench gate power MOSFET according to claim 3, wherein in step 8 a contact region is formed at a bottom of the contact hole while the well contact region is formed at the same time.

5. The manufacturing method of the trench gate power MOSFET according to claim 1, wherein the first epitaxial layer is a silicon epitaxial layer.

6. The manufacturing method of the trench gate power MOSFET according to claim 5, wherein the first epitaxial layer is formed on a surface of a silicon substrate.

7. The manufacturing method of the trench gate power MOSFET according to claim 1, wherein the gate dielectric layer is a gate oxide layer.

8. The manufacturing method of the trench gate power MOSFET according to claim 1, wherein the trench gate power MOSFET is an N-type device, the first conduction type is N and the second conduction type is P; or, the trench gate power MOSFET is a P-type device, the first conduction type is P and the second conduction type is N.

* * * * *